United States Patent
Ruelke et al.

(10) Patent No.: US 10,936,006 B1
(45) Date of Patent: Mar. 2, 2021

(54) CLOCK DISTRIBUTION NETWORK AND METHOD FOR DYNAMICALLY CHANGING A CLOCK FREQUENCY IN A DIGITAL PROCESSING SYSTEM

(71) Applicant: MOTOROLA SOLUTIONS, INC., Chicago, IL (US)

(72) Inventors: Charles R. Ruelke, Coral Springs, FL (US); Johnny R. Ferreira, Sunrise, FL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 16/557,290

(22) Filed: Aug. 30, 2019

(51) Int. Cl.
*G06F 1/08* (2006.01)
*G06F 1/324* (2019.01)
*G06F 1/3237* (2019.01)

(52) U.S. Cl.
CPC ............... *G06F 1/08* (2013.01); *G06F 1/324* (2013.01); *G06F 1/3237* (2013.01)

(58) Field of Classification Search
CPC ........... G06F 1/08; G06F 1/3237; G06F 1/324
See application file for complete search history.

(56) References Cited

U.S. PATENT DOCUMENTS

| | | | |
|---|---|---|---|
| 6,515,530 B1 | 2/2003 | Boerstler et al. | |
| 7,430,676 B2 | 9/2008 | Baker et al. | |
| 9,703,314 B2 * | 7/2017 | Pessa | H04W 52/0287 |
| 2008/0028249 A1 | 1/2008 | Agrawal | |

* cited by examiner

Primary Examiner — Patrick O Neill
(74) Attorney, Agent, or Firm — Michael Best & Friedrich LLP

(57) ABSTRACT

Clock distribution network and method for dynamically changing clock frequency in digital processing system are provided. The method includes receiving, at a first clock input of a first divider, a frequency signal from a clock source and receiving, at a state machine, a first status signal from the first divider, the first status signal indicating a first number of clock edges that have transpired from a first phase reference clock edge of the first divider. The method includes asserting, using the state machine, a first hold signal at a first hold input of the first divider, the first hold signal suspending operation of the first divider when asserted and after asserting the first hold signal, latching a new first divider value into the first divider. The method includes de-asserting, using the state machine, the first hold signal subsequent to latching the new first divider value into the first divider.

20 Claims, 6 Drawing Sheets

CLOCK DISTRIBUTION NETWORK AND METHOD FOR DYNAMICALLY CHANGING A CLOCK FREQUENCY IN A DIGITAL PROCESSING SYSTEM

BACKGROUND OF THE INVENTION

Digital processing systems include a frequency generation unit (FGU) that provides a master clock signal. The master clock signal is provided to clock dividers that provide clock signals at different frequencies to peripheral units of the digital processing system.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
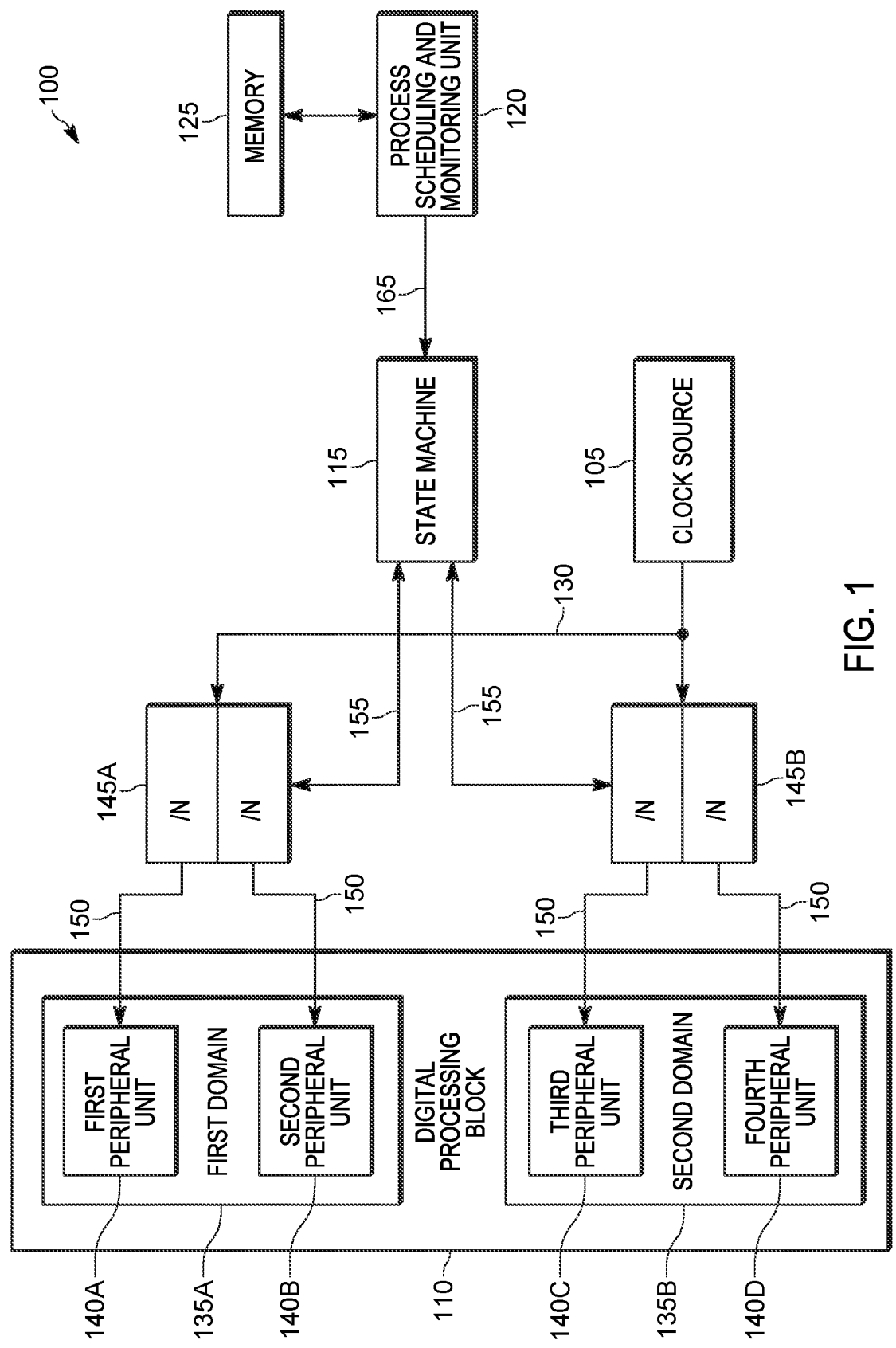
FIG. 1 is a block diagram of a clock distribution network according to one embodiment.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Adjusting the frequency of the clock signals provided to the peripheral units based on desired system performance, current peripheral loading, and anticipated system loading provide significant energy savings to the digital processing system.

Current dynamic frequency scaling (DFS) processes that preserve real time, clock signal phase alignment within a clock distribution network involve significant complexity in control of the FGU. As an alternative to synchronous DFS, divider values may be asynchronously changed to produce a change in frequency. However, asynchronously changing divider settings without controlling ongoing processes in the peripheral units often corrupts synchronicity between software routines by introducing glitches in the clock signal waveform. Asynchronous divider changes can also introduce clock transients that hang the digital processing system unless the peripheral units are first parked in a "safe mode" prior to an asynchronous divider change.

Accordingly, there is a need for an efficient and simple method for changing clock frequency dynamically without parking ongoing processes or inducing clock glitches that may latch up the digital processing systems.

As a consequence, one embodiment provides a clock distribution network for changing a clock frequency within a digital processing system. The clock distribution network includes a clock source providing a frequency signal and a first divider. The first divider includes a first clock input for receiving the frequency signal and a first hold input for receiving a first hold signal that suspends operation of the first divider when asserted. The first divider also includes a first status output for providing a first status signal indicating a first number of clock edges that have transpired from a first phase reference clock edge of the first divider. The clock distribution network also includes a state machine configured to receive the first status signal and assert the first hold signal when the first number of clock edges reaches a first threshold divider count value associated with the first divider. The state machine is also configured to, after the first hold signal is asserted, latch a new first divider value into the first divider, and de-assert the first hold signal in response to latching the new first divider value into the first divider.

Another embodiment provides a method for changing a clock frequency within a digital processing system. The method includes receiving, at a first clock input of a first divider, a frequency signal from a clock source and receiving, at a state machine, a first status signal from the first divider, the first status signal indicating a first number of clock edges that have transpired from a first phase reference clock edge of the first divider. The method also includes asserting, using the state machine, a first hold signal at a first hold input of the first divider, the first hold signal suspending operation of the first divider when asserted and after asserting the first hold signal, latching a new first divider value into the first divider. The method further includes de-asserting, using the state machine, the first hold signal in response to latching the new first divider value into the first divider.

FIG. 1 is a block diagram of one example embodiment of a clock distribution network 100 for dynamically changing clock frequency. The clock distribution network 100 is implemented in a digital processing system this is provided in, for example, a mobile two-way radio, a portable two-way radio, a smart telephone, a tablet computer, a laptop computer, and the like. The digital processing system is particularly useful in systems with limited power availability, for example, devices powered by a battery pack. In the example illustrated, the clock distribution network 100 includes a clock source 105, a digital processing block 110, a state machine 115, a process scheduling and monitoring unit 120, and a memory 125. The clock distribution network 100 may include more or fewer components and may perform additional functions other than those described herein.

The clock source 105, sometimes also referred to as a frequency generation unit (FGU), is the main digital clock source of the clock distribution network 100 and generates a frequency signal 130 having a particular clock frequency. The frequency signal 130 is the main source clock signal of the clock distribution network 100 and is routed to the components of the clock distribution network 100 for operation of the components. The clock source 105 is, for example, a crystal oscillator that oscillates with a particular frequency when excited with an electrical signal.

The digital processing block 110 includes the functional components that perform various operating functions of the digital processing system. The components of the digital processing block 110 operate based on the clock signals received by the components. The digital processing block 110 may be divided into several operating clock domains 135, for example, a first operating clock domain 135A and a second operating clock domain 135B. Each domain 135 may include several peripheral units 140. For example, the first operating clock domain 135A includes a first peripheral unit 140A and a second peripheral unit 140B and the second operating clock domain 135B includes a third peripheral unit 140C and a fourth peripheral unit 140D. The peripheral units 140 are, for example, host processors, digital signal processors (DSP), direct memory access (DMA) state machines, an advanced extensible interface (AXI) bus, peripheral communication interfaces (for example, SPI, UART, SSI, USB, I2S, I2C, and the like), a timer, memory components (for example, I-cache, D-cache, RAM, tightly coupled memory, and the like), configuration registers, and the like.

The clock distribution network 100 also includes several divider networks 145 that provide clock signals 150 to the several peripheral units 140. For example, the clock distribution network 100 includes a first divider network 145A to provide clock signals 150 to the peripheral units 140 in the first operating clock domain 135A and a second divider network 145B to provide clock signals 150 to the peripheral units 140 in the second operating clock domain 135B. The divider networks 145 receive the frequency signal 130 from the clock source 105 and divide the frequency signal 130 by a natural number to generate clock signals 150. These generated clock signals 150 are then provided to individual peripheral units 140 to enable operation of the digital processing block 110 as further explained below with respect to FIG. 2. Each of the clock signals 150 are not individually labeled. However, different clock signals 150 provided to different peripheral units 140 may have different frequencies depending on the peripheral unit 140.

The state machine 115 is, for example, a hardware state machine implemented on a field programmable gate array (FPGA), an application specific integrated circuit (ASIC), or the like, or a software implemented state machine programmed in memory and executed by an electronic processor or other processing unit of the digital processing system. The state machine 115 communicates with the divider networks 145 over a communication lines 155 to receive telemetry signals from the divider networks 145 and to provide control signals to the divider networks 145 to reconfigure dividers in the divider networks 145 as further explained below with respect to FIG. 3. The process scheduling and monitoring unit 120 may similarly be implemented on a FPGA, an ASIC, or the like, or a software implemented module programmed on an electronic processor or other processing unit of the digital processing system. In one embodiment, the state machine 115 and the process scheduling and monitoring unit 120 are functional modules of an electronic processor. The electronic processor is implemented as a microprocessor with separate memory, for example, the memory 125. In other embodiments, the electronic processor is implemented as a microcontroller or digital signal processor (with memory 125 on the same chip). In other embodiments, the electronic processor is implemented using multiple processors. In addition, the electronic processor may be implemented partially or entirely as, for example, a field-programmable gate array (FPGA), an application specific integrated circuit (ASIC), and the like and the memory 125 may not be needed or be modified accordingly. In the example illustrated, the memory 125 includes non-transitory, computer-readable memory that stores instructions (for example, the state machine 115 and the process scheduling and monitoring unit 120) that are received and executed by the electronic processor to carry out the functionality of the clock distribution network 100 as described herein or the digital processing system. The memory 125 may include, for example, a program storage area and a data storage area. The program storage area and the data storage area may include combinations of different types of memory, for example, read-only memory and random-access memory.

The memory 125 stores configuration information for ongoing and scheduled processes (that is, the processor loading conditions and configuration settings) of the digital processing block 110. The process scheduling and monitoring unit 120, in one example, analyzes the status of ongoing processes and schedules future process events stored in the memory 125. By analyzing current activity level and projecting future scheduled events, the process scheduling and monitoring unit 120 determines or identifies light loading conditions to provide a loading condition signal 165 to the state machine 115. As indicated by the loading condition signal 165, the state machine 115 reconfigures the divider networks 145 to vary respective output clock signals 150. Light loading conditions may include, for example, periods of time during the operation of the digital processing system where the load demanded from the peripheral units 140 is low and it is not desirable from a system efficiency perspective to operate the digital processing system at peak processing performance. The load demanded from the peripheral units 140 is, for example, the processing clock cycles per unit of time to complete a required amount of work. Light loading condition may also include periods of time where algorithmic processing of data is minimal, maintenance of ongoing operational modes is not required, or transitions between different operational states is not occurring. Transitions between different operational states includes, for example, transitioning from a receive mode to a transmit mode, transitioning from a first communication protocol to a second communication protocol, or the like. In one example, the digital processing system is implemented in a two-way radio and the process scheduling and monitoring unit 120 identifies down times of the two-way radio, for example, when the two-way radio is in standby mode, idle operation, battery save mode, or the like where ongoing processing of data is minimized. In these modes, scheduling of active processes is not required to support a user operation in the field.

Figure 2:
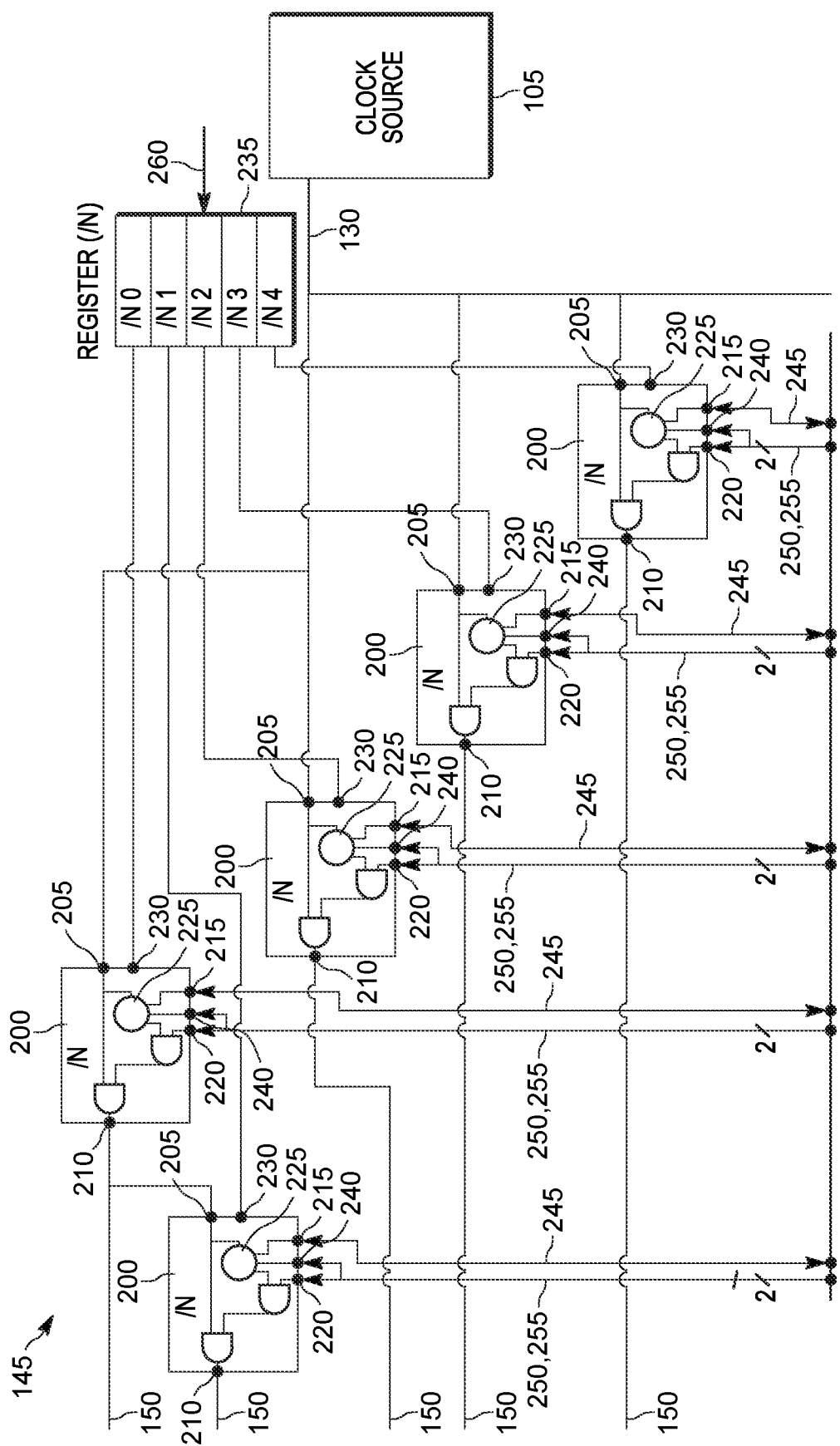
FIG. 2 is a block diagram of a divider network of the clock distribution network of FIG. 1 in accordance with some embodiments.

FIG. 2 is a block diagram of one example embodiment of the divider network 145. In the example illustrated, the divider network 145 includes a plurality of dividers 200 (for example, a first divider and a second divider). The dividers 200 may be singularly referred to as a divider 200. Each divider 200 includes a clock input 205 (for example, a first clock input and a second clock input), a clock output 210 (for example, a first clock output and a second clock output), a status output 215 (for example, a first status output and a second status output), and a hold input 220 (for example, a first hold input and a second hold input). The divider network 145 and the dividers 200 may include more or fewer components and may perform additional functions other than those described herein.

The clock input 205 receives the frequency signal 130 from the clock source 105. In some embodiments, a divider 200 (for example, a second divider) may be concatenated with another divider 200 (for example, a first divider) such that the second divider 200 receives the clock signal 150 of the first divider 200 at the clock input 205 of the second divider. The below explanation is provided with the clock input 205 receiving the frequency signal 130 to simplify the explanation, however, the description is equally applicable to a situation where one divider 200 is concatenated with another divider 200.

The clock output 210 provides a clock signal 150 to one or more peripheral units 140 and/or one or more dividers 200. The dividers 200 divide the frequency of the frequency signal 130 by a divider value, which is an integer, to generate the clock signals 150. In the example illustrated, to divide a frequency by a divider value of four, a divider 200 includes a counter 225 (for example, a first counter and a second counter) to count four contiguous clock edges (both rising and falling edges) of the frequency signal 130 before switching the clock signal 150 from an initial logic low state to a logic high state. The counter 225 subsequently counts the next four contiguous clock edges of the frequency signal 130 before the divider 200 switches the clock signal 150 from the logic high state to a logic low state, thereby completing one clock period at the divider output signal 150. In this way, there are four (4) full input clock periods for each output clock period, thereby creating a divide-by-4 output signal. Alternatively, the clock period for an input signal 130 may be determined by counting contiguous rising clock edges of the frequency signal 130 or counting contiguous falling clock edges of the frequency signal 130. When the counter 225 is only counting rising clock edges, the counter 225 will count two contiguous rising edges of the frequency signal 130 before switching the clock signal 150 from an initial logic low state to a logic high state. The counter 225 subsequently counts the next two rising clock edges of the frequency signal 130 before the divider 200 completes the output clock period by switching the clock signal 150 from the logic high state to a logic low state. When the counter 225 reaches the divider value (that is, four rising clock edges in this case), the divider 200 provides the next edge on the clock signal 150 that corresponds to a complete clock period at output clock signal 150. The logic transition at the clock output 210 occurs synchronous to an appropriate clock edge at the clock input 205.

The dividers 200 also include a divider value input 230 to receive a divider value from a divider value register 235. Each divider 200 has an associated register location in the divider value register 235. The register location in the divider value register 235 stores a divider value for the associated divider 200. The divider value register 235 stores the divider values (that is, the plurality of divider values) for the plurality of dividers 200 of the divider network 145. The dividers 200 include a load input 240 that receives a load signal 255 from the state machine 115 such that the divider 200 latches a new divider value (for example, a new first divider value and a new second divider value) into the divider 200 when the load signal 255 is asserted. Asserting the load signal 255 triggers the divider 200 to load the new divider value from divider value register 235 into the divider counter 225. The divider values may be loaded into the divider value register 235 by the state machine 115 (or another processor) at any time after divider value register 235 receives register update trigger signal 260. In some embodiments, the load signal 255 to divider 200 is asserted only after the register update trigger signal 260 has been first asserted to the divider value register 235, and after the appropriate new values have been loaded into the proper address locations in the divider value register 235.

The status output 215 provides a status signal 245 (for example, a first status signal and a second status signal) to the state machine 115. The status signal 245 indicates a number of clock edges (for example, a first number of clock edges and a second number of clock edges) that have transpired from a phase reference clock edge (for example, a first phase reference clock edge and a second phase reference clock edge) of the divider 200. A phase reference clock edge is defined as the clock edge at the clock input 205 where the divider counter 225 completes a full count value, thereby triggering a signal transition at the clock output 210. At the phase reference clock edge both signals at the clock output 210 and the clock input 205 transition between the same logic states (for example, between a logic low state to a logic high state). In some embodiments, a full divider threshold count value is equal to the divider setting (when counting only rising or falling clock edges), which also marks the completion of a single clock period at divider output 210. In one example, a zero degree phase reference clock edge is a positive clock edge or a rising clock edge at the clock input 205 (for example, the frequency signal 130) that results in a corresponding rising clock edge on the clock output 210 (that is, the clock signal 150). A 180 degree phase reference clock edge is a negative clock edge or a falling clock edge on the clock input 205 that results in a corresponding falling clock edge on the clock output 210. The number of clock edges are counted using the counter 225 and refer to clock edges of the frequency signal 130 or the signal received at the clock input 205.

The hold input 220 receives a hold signal 250 (for example, a first hold signal and a second hold signal) from the state machine 115. The divider 200 suspends operations when the hold signal 250 is asserted, thereby disabling the divider 200 function. That is, the divider 200 disables the counter 225 such that the clock signal 150 remains in the previous state (that is, high or low) before operations are suspended. The clock edge count sequencing is suspended while still preserving counter 225 legacy count value.

The hold signal 250 is asserted before the new divider value is loaded into the divider 200. The hold signal 250 may be de-asserted to resume dividing operation of the divider 200. Once the hold signal 250 is de-asserted, the divider 200 restarts the counter 225 to appropriately generate the next clock edge in the clock signal 150 at divider output 210. In some embodiments, the load signal 255 is combined with the hold signal 250 to assert a single signal that first suspends the divider 200 and then loads a new divider value into the divider 200. The status signal 245, the hold signal 250, and the load signal 255 correspond to the communication lines 155 of FIG. 1.

Figure 3:
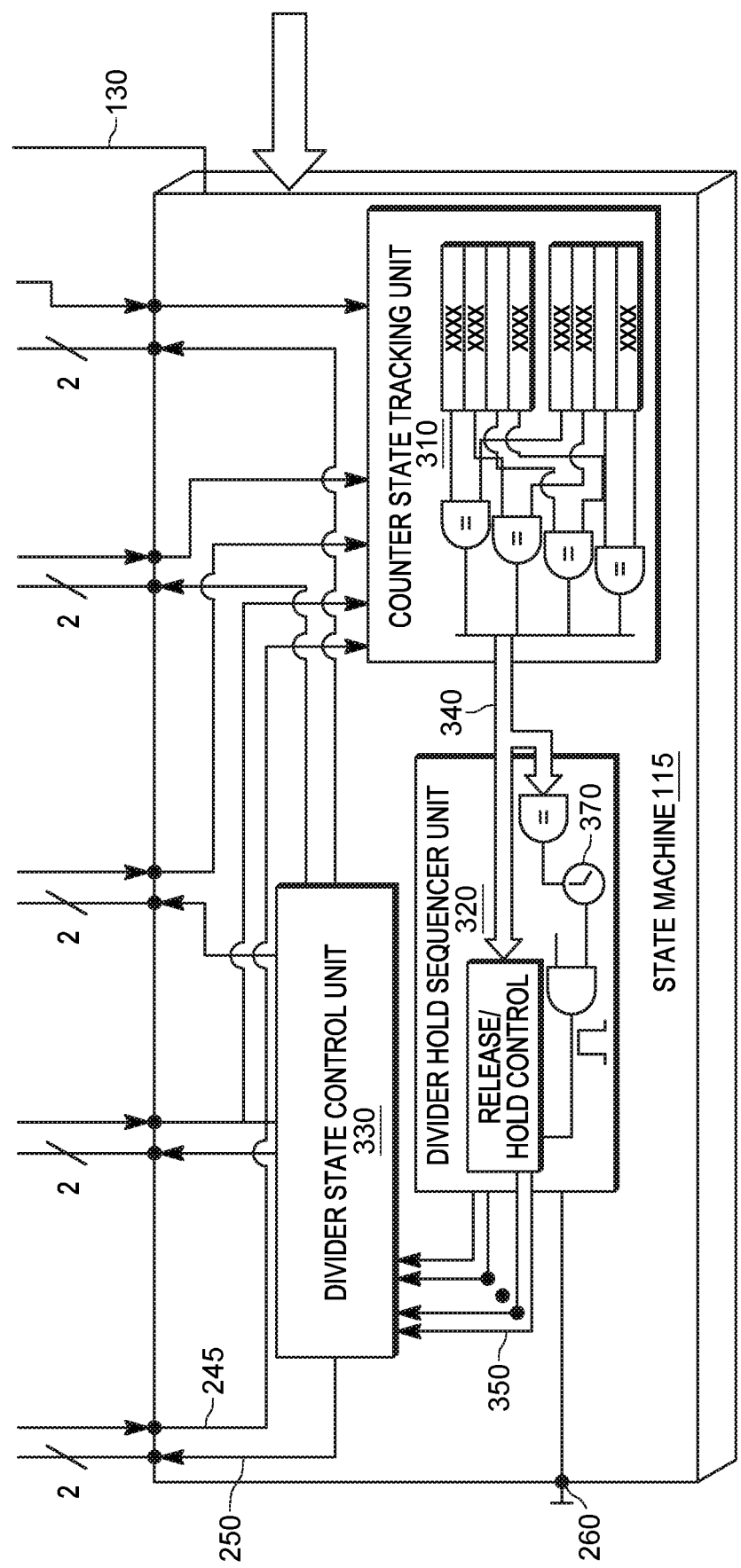
FIG. 3 illustrates a state machine of the clock distribution network of FIG. 1 in accordance with some embodiments.

FIG. 3 is a functional block diagram of one example embodiment of the state machine 115. In the example illustrated, the state machine 115 includes a counter state tracking unit 310, a divider hold sequencer unit 320, and a divider state control unit 330. The state machine 115 may include more or fewer components and may perform additional functions other than those described herein.

The counter state tracking unit 310 receives the status signals 245 from the dividers 200. The counter state tracking unit 310 compares the count status of each divider 200 to a threshold count value indicating the divider's phase reference clock edge as determined by the corresponding divider value of the divider 200. If the divider 200 is targeted for a divider configuration change (that is, divider value change), the counter state tracking unit 310 generates a trigger signal 340 associated with the divider 200. The trigger signal 340 for a divider 200 is generated when the status signal 245 from the divider 200 indicates that a phase reference clock edge transition has occurred. The counter state tracking unit 310 thereby tracks the status of each divider 200 and provides trigger signals 340 to the divider hold sequencer unit 320.

The divider hold sequencer unit 320 processes the trigger signal 340 to generate hold control signals 350 to divider state control unit 330, which sets the timing of the assertion sequence for hold signals 250 and load signals 255. The divider hold sequencer unit 320 also includes a delay period counter 370 that determines a delay period prior to resumption of dividers 200 (that is, de-asserting hold signals 250). The divider hold sequencer unit 320 provides the register update trigger signals 260 to the divider value register 235

The divider state control unit 330 provides appropriate sequencing of the hold signals 250 and the load signals 255 to the dividers 200. The hold signals 250 and the load signals 255 are unique for each divider 200. In one embodiment, the frequency signal 130 is provided to the state machine 115 from clock source 105. In another embodiment, the frequency signal 130 provided to the state machine 115 can be from any frequency source having a frequency that is equal to or greater than the signal source originating from clock source 105. The frequency signal 130 into the state machine 115 is applied so as to facilitate the operation of the state machine 115 regardless of the operating state of the dividers 200. Each of functional blocks are explained in detail below with respect to flowcharts in FIGS. 4 and 6.

Figure 4:
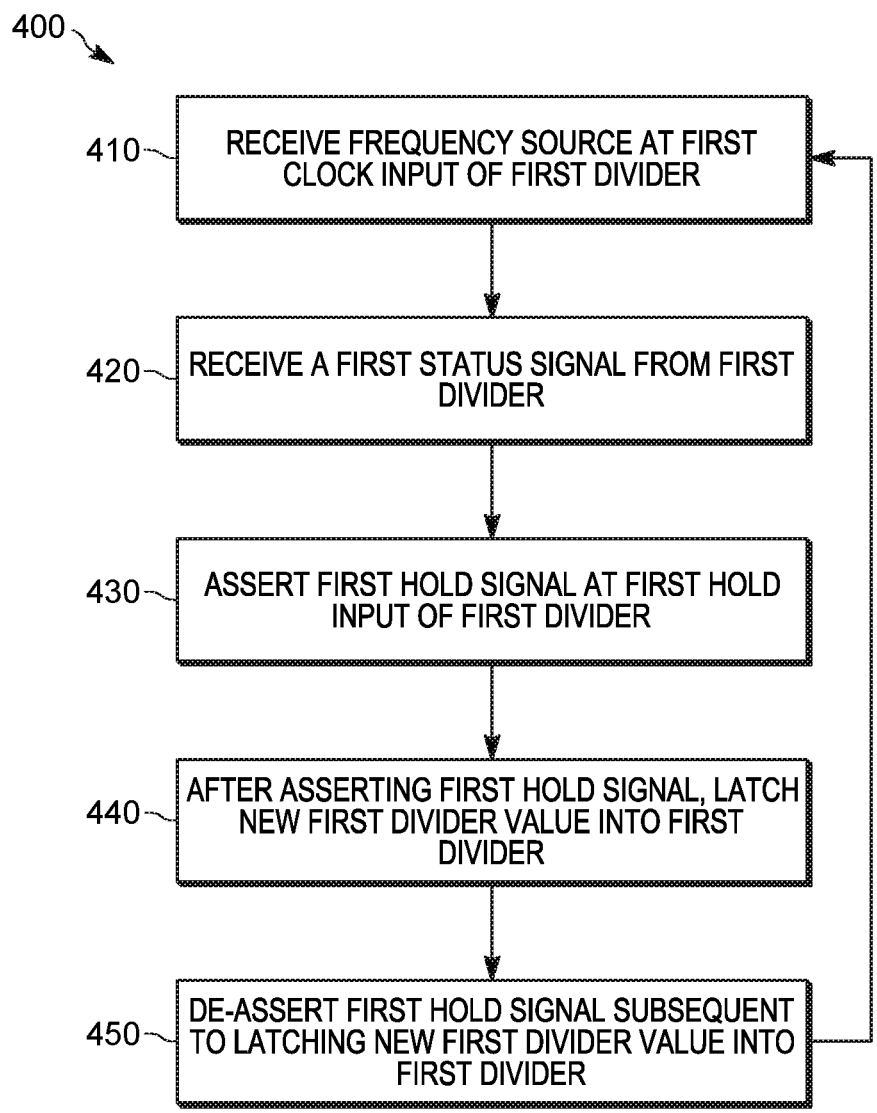
FIG. 4 is a flowchart of a method for changing a clock frequency within a digital processing system in accordance with some embodiments.

FIG. 4 is a flowchart of one example method 400 for changing a clock frequency within a digital processing system. In the example illustrated, the method 400 includes receiving, at a first clock input 205 of a first divider 200, the frequency signal 130 from a clock source 105 (at block 410). The clock source 105 is the global clock source and provides the frequency signal 130 to the divider networks 145.

The method 400 includes receiving, at the state machine 115, a first status signal 245 from the first divider 200, the first status signal 245 indicating a first number of clock edges at divider input 205 that have transpired from a first phase reference clock edge of the first divider 200 (at block 420). The first status signal 245 is received by the counter state tracking unit 310. The first status signal 245 may be provided continuously such that the first number of clock edges is provided to the state machine 115 at every clock edge of the frequency signal 130. Providing status signals at each clock edge allows the counter state tracking unit 310 to maintain real-time diagnostics of the first divider 200 and to preset triggering events to accommodate timing latency in divider control signals (for example, the hold signal 250 and the load signal 255). The counter state tracking unit 310 keeps track of the counter state of the first divider 200.

The method 400 includes asserting, using the state machine 115, a first hold signal 250 at a first hold input 220 of the first divider 200, the first hold signal 250 suspending operation of the first divider 200 when asserted (at block 430). The hold signal 250 is asserted, for example, at the zero degree phase reference clock edge of the first divider 200. The counter state tracking unit 310 determines whether a first counter 225 of the first divider 200 is at the state where the clock signal 150 of the divider 200 switches the output state at a zero degree phase reference clock edge. For example, the counter state tracking unit 310 compares the first number of clock edge counted from counter 225 to a first threshold divider count value associated with the first divider 200 (that is, a zero degree phase reference clock edge of the first divider 200) and outputs a first trigger signal 340 associated with the first divider 200 to the divider hold sequencer unit 320. The divider hold sequencer unit 320 asserts the first hold signal 250 upon receiving the first trigger signal 340. The counter state tracking unit 310 monitors for the zero degree phase reference clock edge at the first divider output clock signal 150 by counting the number of input clock edges at divider input 205. The counter state tracking unit 310 provides the first trigger signal 340 when the zero degree phase reference clock edge of the first clock signal 150 is detected. The counter state tracking unit 310 (or the state machine 115) detects the zero degree phase reference clock edge when the first number of clock edges equals the first threshold divider count value. The divider hold sequencer unit 320 provides a first hold control signal 350 to the divider state control unit 330, which asserts the first hold signal 250 to the first divider 200 in response to the first hold control signal 350. The first divider 200 suspends operations when the first hold signal 250 is asserted.

The method 400 includes, after asserting the first hold signal 250, latching a new first divider value into the first divider 200 (at block 440). After asserting the first hold signal 250, the divider state control unit 330 asserts a first load signal 255 at a first load input 240 of the first divider 200 and the first divider 200 latches the new first divider value into the first counter 225 in response to assertion of the first load signal 255 at the first load input 240.

In the example illustrated, the method 400 also includes de-asserting, using the state machine 115, the first hold signal 250 subsequent to latching the new first divider value into the first divider 200 (at block 450). After the new first divider value is loaded into the first divider 200, the divider state control unit 330 de-asserts the first hold signal 250. In response to the first hold signal 250 being de-asserted, the first divider 200 resumes normal operation, which includes restarting of clock edge counting with the counter 225 using the new first divider value. Because the counter 225 is placed into a hold state at the zero degree phase reference clock edge, the beginning value at which the counter 225 resumes is set to an initial value of zero. The frequency of the first clock signal 150 of the first divider 200 is changed by loading the new first divider value into the first divider 200. In some embodiments, the divider state control unit 330 may release the first divider 200 from the hold state only after certain conditions governing divider activation are met. These conditions include, for example, completion of loading a new divider value, suspension of all operations for multiple dividers that are targeted for tandem configuration changes, subsequent loading of new divider values into the multiple dividers when in the hold state, and/or the like.

Figure 5:
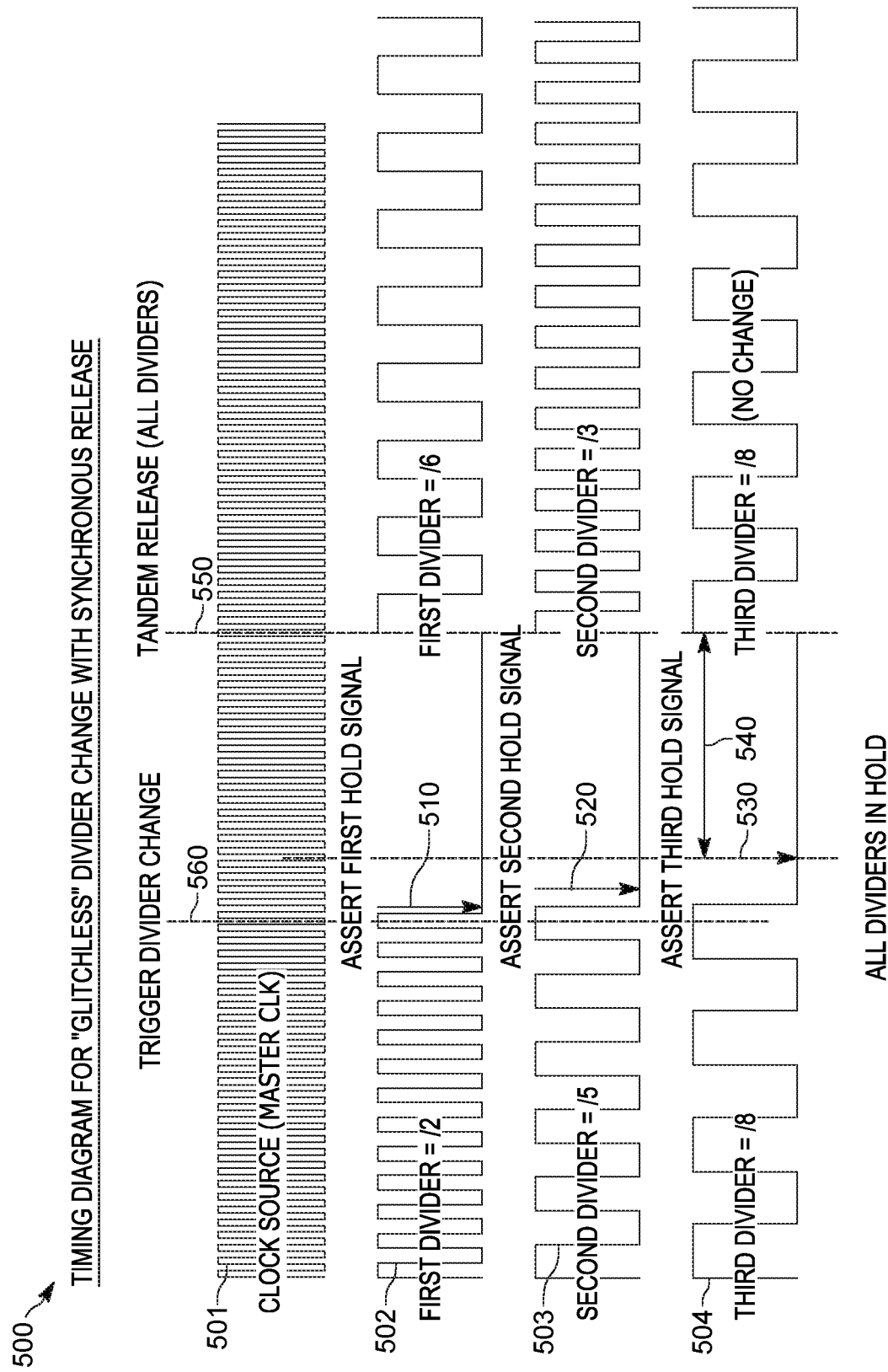
FIG. 5 is a timing diagram illustrating a divider change with synchronous release of multiple dividers in accordance with some embodiments.

The method 400 may be repeated for each clock frequency change of the first divider 200. Additionally, the method 400 may also be used for changing a clock frequency of other dividers 200 or for changing the clock frequency of a plurality of dividers 200 at the same time. FIG. 5 illustrates a timing diagram 500 of one example of changing the clock frequency of a plurality of dividers 200 at the same time. The timing diagram 500 includes a first waveform 501 representing the frequency signal 130, a second waveform 502 representing a clock signal 150 output from a first divider 200, a third waveform 503 representing a clock signal 150 output from a second divider 200, and a fourth waveform 504 representing a clock signal output from a third divider 200. In the example illustrated in FIG. 5, the first divider 200 has a first divider value of 2 that is being changed to a new first divider value of 6. The second divider 200 has a second divider value of 5 that is being changed to a new second divider value of 3. The third divider 200 has a third divider value of 8 that will remain unchanged after release. Below, an example of performing the method 400 for changing the clock frequency of a plurality of dividers 200 is explained with the example of a second divider 200, a third divider 200, and FIGS. 4 and 5.

The first divider 200 may provide a first clock signal 150 to a first peripheral unit 140A, the second divider 200 may provide a second clock signal 150 to a second peripheral unit 140B, and the third divider 200 may provide a third clock signal 150 to a third peripheral unit 140C. In some embodiments, the first divider 200 may provide the first clock signal 150 to a first peripheral unit 140A that is a part of the first operating clock domain 135A and the second divider 200 may provide the second clock signal 150 to a third peripheral unit 140C (for example, second peripheral unit) that is a part of the second operating clock domain 135B. In the following explanation, corresponding steps are performed simultaneously where feasible.

The method 400 includes receiving, at a second clock input 205 of a second divider 200, the frequency signal 130. As discussed above, in some embodiments, the second divider 200 is concatenated with the first divider 200. In these embodiments, the method 400 includes receiving, at the second clock input 205 of the second divider 200, a first clock signal 150 form the first divider 200.

A second status signal 245 is received, via the state machine 115, from the second divider 200. The second status signal 245 indicates a second number of clock edges that have transpired from second phase reference clock edge of the second divider 200. The first status signal 245 and the second status signal 245 are received by the counter state tracking unit 310. The second status signal 245 from second divider 200 may be provided continuously such that the second number of clock edges is provided to the state machine 115 at every clock edge of the frequency signal 130. The counter state tracking unit 310 keeps track of the counter state of the second counter 225 of the second divider 200.

The method 400 also includes asserting, using the state machine 115, a second hold signal 250 at a second hold input 220 of the second divider 200, the second hold signal 250 suspending operation of the second divider 200 when asserted. The second hold signal is asserted, for example, at the zero degree phase reference clock edge of the second divider 200. The counter state tracking unit 310 determines whether a counter 225 of the each divider 200 is at the state where the clock signal 150 of the divider 200 switches the output state at a zero degree phase reference clock edge. For example, the counter state tracking unit 310 compares the second number of clock edges to a second threshold divider count value associated with the second divider 200 (that is, a zero degree phase reference clock edge of the second divider 200) and outputs a second trigger signal 340 to the divider hold sequencer unit 320. After receiving a second trigger signal 340, the divider hold sequencer unit 320 asserts a second hold signal 250 to divider state control unit 330, which sets the timing of the assertion sequence for hold signals 250 and load signals 255. As discussed above, the counter state tracking unit 310 monitors the second status signal 245 for the zero degree phase reference clock edge of the second clock signal 150. The counter state tracking unit 310 provides the second trigger signal 340 when the zero degree phase reference clock edge of the second clock signal 150 is detected. The counter state tracking unit 310 (or the state machine 115) detects the zero degree phase reference clock edge when the second number of clock edges equals the second threshold divider count value, which also corresponds to the completion of a full clock period at the second divider output 210. The divider hold sequencer unit 320 provides a second hold control signal 350 to the divider state control unit 330, which asserts the second hold signal 250 in response to the second hold control signal 350. As shown in FIG. 5, the first hold signal 250 is asserted at a first zero degree phase reference clock edge 510, the second hold signal 250 is asserted at a second zero degree phase reference clock edge 520, and a third hold signal 250 is asserted at a third zero degree phase reference clock edge 530. All dividers 200 are in hold when the final zero degree phase reference clock edge 530 is detected. The first divider 200, the second divider 200, and the third divider 200 suspend operations when the first hold signal 250, the second hold signal 250, and the third hold signal 250 are asserted respectively.

After asserting the second hold signal 250, a new second divider value is latched into the second divider 200. After asserting the second hold signal 250, the divider state control unit 330 asserts a second load signal 255 at a second load input 240 of the second divider 200 and the second divider 200 latches the new second divider value into a second counter 225 of the second divider 200 in response to assertion of the second load signal 255 at the second load input 240. Similarly, a new third divider value is latched into the third divider 200. The second load signal 255 and the third load signal 255 are asserted after the second hold signal 250 and the third hold signal 250 are asserted respectively.

The divider hold sequencer unit 320 also controls the register update trigger signals 260. The register update trigger signal 260 triggers an update of the divider values stored in the divider value register 235. The register update trigger signal 260 may be a single trigger signal to the divider value register 235 triggering an update of all divider values, or a plurality of signals where each register update trigger signal 260 triggers an update to a specific address in the divider value register 235. When a register update trigger signal 260 is not asserted, the corresponding divider value in the divider value register 235 is assumed current. When a register update trigger signal 260 is asserted, the process scheduling and monitoring unit 120 may load a corresponding new divider value into the divider value register 235. The new divider values are subsequently latched into the corresponding dividers 200. The process scheduling and monitoring unit 120 may indicate to the divider hold sequencer unit 320 that new divider settings are desired to be loaded into dividers 200. In response, the divider hold sequencer unit 320 asserts register update trigger signal 260 at clock edge 560 of FIG. 5 to allow new divider values to be loaded into divider value register 235. In some embodiments, the register update trigger signals 260 are triggered once, causing all new divider setting to be loaded into the divider value register 235 in tandem. The register update trigger signals 260 are timed to be asserted before beginning reconfiguration of the dividers 200, for example, at clock edge 560.

As shown in FIG. 5, a delay period 540 occurs after all dividers 200 are placed in hold such that the new divider values can be loaded into the dividers 200. The delay period 540 extends the hold period, during which the dividers 200 are disabled, to a duration desired for completing configuration changes to the dividers 200. In FIG. 5, the delay period 540 is exaggerated for illustration, however, the delay period 540 may have a value smaller or larger than illustrated. The delay period 540 is appropriately adjusted to accommodate timing latency associated with loading new divider values into the dividers 200, processing interrupt signals between state machine 115 and the process scheduling and monitoring unit 120, memory access sequences between divider value register 235 and the dividers 200, and the like. The divider hold sequencer unit 320 may implement a delay period counter 370, which when triggered counts a number of clock edges of the frequency signal 130 after the final hold signal 250 is asserted at clock edge 530. The delay period 540 expires when the desired number of clock edges are counted by the delay period counter 370. In some embodiments, the delay period 540 may range from 10 nanoseconds to 78 nanoseconds.

The method 400 includes de-asserting, using the state machine 115, the second hold signal 250 in response to latching the new first divider value into the first divider 200 and latching the new second divider value into the second divider 200. Additionally, the first hold signal 250 is de-asserted in response to both latching the new first divider value into the first divider 200 and latching the new second divider value into the second divider 200 such that the first divider 200 and the second divider 200 are released in tandem. The divider state control unit 330 holds all dividers 200 until new divider values are loaded into all dividers 200. The divider state control unit 330 releases all the dividers 200 at the same time. The divider hold sequencer unit 320 releases the hold control signals 350 to activate the dividers 200 upon expiration of the delay period 640 as determined by the delay period counter 370. The dividers 200 are released when the hold signals 250 are de-asserted. As shown in FIG. 5, all dividers are released in tandem at the tandem release point 550. The dividers 200 now operate using the new divider values after the tandem release point 550. The tandem release point 550 corresponds to a rising clock edge of the frequency signal 130 assuming the divider functionality resumes at a zero degree phase reference clock edge. The tandem release point 550 corresponds to a zero degree phase reference clock edge for all dividers 200. Therefore, the tandem release point 550 corresponds to all divider counters 225 being reset to a starting zero value. As discussed above, the hold signals 250 are also asserted at the zero degree phase reference clock edge. Accordingly, all clock signals 150 transition from a logic low state to the logic high state at the same time when re-activated at a zero degree phase reference clock edge (that is, at the tandem release point 550).

The scheduling configuration changes of dividers 200 is controlled by the process scheduling and monitoring unit 120 of FIG. 1. The timing of when to increase the frequency of a given clock signal 150, when to reduce the frequency of a given clock signal 150, and determining which dividers 200 are to be reconfigured in tandem, may be accomplished by the process scheduling and monitoring unit 120. Increasing the clock frequency of a clock signal 150 is accomplished by reducing the divider value, which in turn increases the Millions-of-Instruction Per Second (that is, MIPS assuming the clock frequency is in Megahertz (MHz)) that can be accomplished by a given peripheral unit 140. Reducing the clock frequency of a clock signal 150 is accomplished by increasing the divider value, which thereby reduces the MIPS that can be accomplished by a peripheral unit 140. Accordingly, the process scheduling and monitoring unit 120 monitors both the current processing activity, as well as the desired projected loading, for peripheral units 140 to identify changes in MIP loading so as to facilitate scaling of the clock signals 150 to match the desired processing MIPS. Once the MIP variations have been identified, the process scheduling and monitoring unit 120 schedules an appropriate divider change using the state machine 115.

Figure 6:
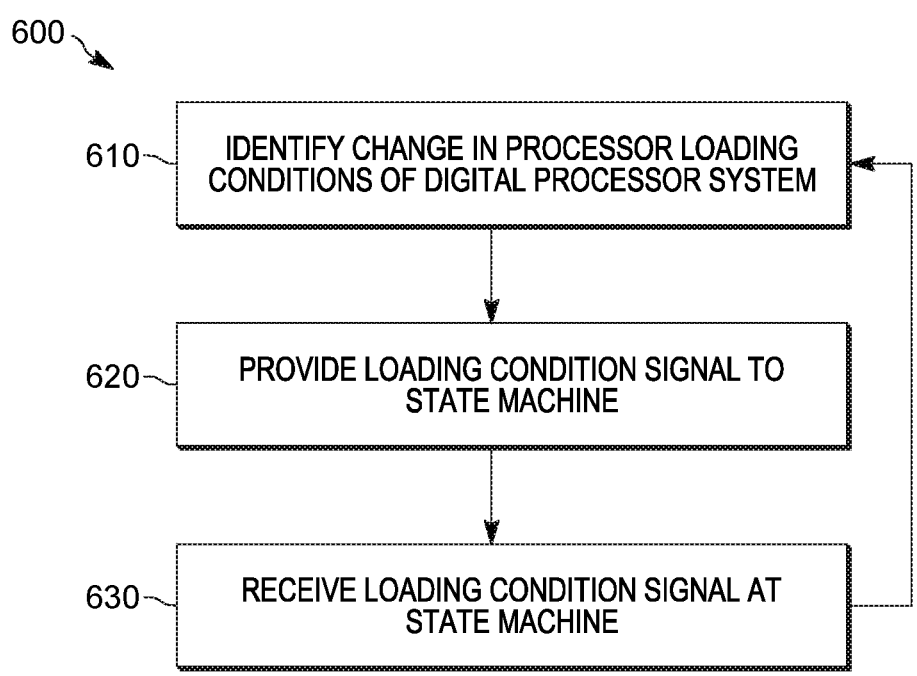
FIG. 6 is a flowchart of a method for changing a clock frequency within a digital processing system in accordance with some embodiments.

FIG. 6 is a flowchart of one example method 600 for changing a clock frequency within a digital processing system. In the example illustrated, the method 600 includes identifying, using a process scheduling and monitoring unit 120, a change in processor loading conditions of a digital processor system 110 including the first divider 200 and the second divider 200 (at block 610). The process scheduling and monitoring unit 120 tracks the current and future processes, for example, background service routine interrupts, peripheral activation and tasking, batch processing, event initiated operating mode changes, and the like. Each process may be assigned a MIPS load factor that is used to determine the overall processor loading conditions. When the process scheduling and monitoring unit 120 determines that a change in the processor loading conditions has occurred, the process scheduling and monitoring unit 120 schedules the appropriate configuration change with the dividers 200. The configuration change is, for example, reducing the frequency of the clock signal 150 (that is, increasing the divider value) when the processes move from a heavy loading condition to a light loading condition or vice versa.

The method 600 includes providing, using the process scheduling and monitoring unit 120, a loading condition signal 165 to the state machine 115 in response to identifying the change in the processor loading conditions (at block 620). When the process scheduling and monitoring unit 120 identifies a change in the processor loading conditions, the process scheduling and monitoring unit 120 may provide new divider values, directly or through the state machine 115, to the divider value register 235. These new divider values are selected based on the loading condition of each peripheral unit 140, and scale the appropriate clock signal 150 frequency as necessary to support the desired processing performed by the peripheral unit 140. The process scheduling and monitoring unit 120 also provides the loading condition signal 165 to the state machine 115 to indicate when the processor loading conditions have sufficiently changed thereby warranting initiating reconfiguration sequence to load the new divider values into the divider networks 145.

The method 600 includes receiving, using the state machine 115, the loading condition signal 165, wherein the new first divider value is latched into the first divider 200 and the new second divider value is latched into the second divider 200 in response to receiving the loading condition signal 165 (at block 630). The state machine 115 may indicate to the process scheduling and monitoring unit 120 that the new divider value sequence has been initiated using loading condition signal 165. The state machine 115 receives the loading condition signal 165 from the process scheduling and monitoring unit 120. As shown in FIG. 5, the state machine 115 triggers a divider change at 560 in response to receiving the loading condition signal 165 from the process scheduling and monitoring unit 120. The state machine 115 may subsequently perform the method 400 to trigger divider change for one or more dividers 200.

The clock distribution network 100, among other things, mitigates glitches that may be induced during the change in clock frequency with little, if any, parking of ongoing processes. Since the clock source 105 is always on, the clock distribution network 100 maintains synchronicity to the zero degree phase reference clock edge for each divider 200 relative to the frequency signal 130 when asserting and de-asserting the hold signals 250. Each divider 200 is suspended in accordance with the periodicity of the divider 200 output frequency 150. This allows for divider value change without separately pausing software routines of the peripheral units 140. The pausing of the clock signal 150 suspends processing of the corresponding software routines. The pausing of the software routine affords an opportunity for the dividers 200 to be reconfigured and subsequently restarted at the zero degree phase reference clock edge. Additionally, since the frequency is not changed at the clock source 105, the device including the clock distribution network 100 maintains communication with external devices and resumes digital processing at the same point in the respective routines where the routines were previously suspended, with reduced or no glitches. Accordingly, dividers 200 may be associated with a single operating clock domain, or multiple operating clock domains. The dividers 200 may be reconfigured in tandem, separately, or not at all as desired by the respective peripheral unit 140 loading in context with strategic scheduling of the divider changes. For example, the dividers 200 may be reconfigured when primary and subordinate routines may absorb a timing ambiguity (that is, delay period 540) without impacting digital system fidelity. Accordingly, even when clock signal 504 is in a different time domain than clock signals 502 and 503, the divider 200 generating clock signal 504 may, or may not, be included in a divider reconfiguration depending on the system processing requirements.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A clock distribution network for changing a clock frequency within a digital processing system, the clock distribution network comprising:
    a clock source providing a frequency signal;
    a first divider including
        a first clock input for receiving the frequency signal,
        a first hold input for receiving a first hold signal that suspends operation of the first divider when asserted, and a first status output for providing a first status signal indicating a first number of clock edges that have transpired from a first phase reference clock edge of the first divider; and a state machine configured to
receive the first status signal,
assert the first hold signal when the first number of clock edges reaches a first threshold divider count value associated with the first divider,
after the first hold signal is asserted, latch a new first divider value into the first divider, and
de-assert the first hold signal subsequent to latching the new first divider value into the first divider.

2. The clock distribution network of claim 1, wherein the first divider further includes a first counter configured to count edges of the frequency signal, wherein the first counter counts the first number of clock edges that have transpired from the first phase reference clock edge.

3. The clock distribution network of claim 1, further comprising:
a second divider including
a second clock input,
a second hold input for receiving a second hold signal that suspends operation of the second divider when asserted, and
a second status output for providing a second status signal indicating a second number of clock edges that have transpired from a second phase reference clock edge of the second divider,
wherein the state machine is further configured to
receive the second status signal,
assert the second hold signal when the second number of clock edges reaches a second threshold divider count value of the second divider,
after the second hold signal is asserted, latch a new second divider value into the second divider, and
de-assert the second hold signal subsequent to latching the new first divider value into the first divider and latching the new second divider value into the second divider, wherein the first hold signal is de-asserted subsequent to latching the new first divider value into the first divider and latching the new second divider value into the second divider such that the first divider and the second divider are released in tandem.

4. The clock distribution network of claim 3, wherein the second clock input receives the frequency signal.

5. The clock distribution network of claim 4, wherein the second divider further includes a second counter configured to count edges of the frequency signal, wherein the second counter counts the second number of clock edges that have transpired from the second phase reference clock edge.

6. The clock distribution network of claim 3, wherein the second divider is concatenated with the first divider such that the second clock input receives a first clock signal from the first divider.

7. The clock distribution network of claim 3, further comprising:
a divider value register storing a plurality of divider values and configured to update the plurality of divider values to store the new first divider value and the new second divider value when a register update trigger signal is asserted at the divider value register,
wherein the first divider includes a first load input to receive a first load signal, wherein the first divider loads the new first divider value in response to the state machine asserting the first load signal, and wherein the second divider includes a second load input to receive a second load signal, wherein the second divider loads the new second divider value in response to the state machine asserting the second load signal.

8. The clock distribution network of claim 7, wherein the state machine is further configured to assert the first load signal and the second load signal after:
register update trigger signal has been first asserted at the divider value register; and
the new first divider value and the new second divider value are stored in the divider value register.

9. The clock distribution network of claim 3, further comprising:
a process scheduling and monitoring unit configured to identify a change in processor loading conditions of the digital processing system and provide a loading condition signal to the state machine in response to identifying the change in the processor loading conditions,
wherein the state machine is configured to receive the loading condition signal, wherein the state machine latches the new first divider value into the first divider and latches the new second divider value into the second divider in response to receiving the loading condition signal.

10. The clock distribution network of claim 3, wherein the first divider provides a first clock signal to a first peripheral unit of the digital processing system and the second divider provides a second clock signal to a second peripheral unit of the digital processing system.

11. A method for changing a clock frequency within a digital processing system, the method comprising:
receiving, at a first clock input of a first divider, a frequency signal from a clock source;
receiving, at a state machine, a first status signal from the first divider, the first status signal indicating a first number of clock edges that have transpired from a first phase reference clock edge of the first divider;
asserting, using the state machine, a first hold signal at a first hold input of the first divider, the first hold signal suspending operation of the first divider when asserted;
after asserting the first hold signal, latching a new first divider value into the first divider; and
de-asserting, using the state machine, the first hold signal subsequent to latching the new first divider value into the first divider.

12. The method of claim 11, further comprising:
counting, using a first counter of the first divider, edges of the frequency signal, wherein the first counter counts the first number of clock edges that have transpired from the first phase reference clock edge.

13. The method of claim 11, further comprising:
receiving, at the state machine, a second status signal from a second divider, the second status signal indicating a second number of clock edges that have transpired from a second phase reference clock edge of the second divider;
asserting, using the state machine, a second hold signal at a second hold input of the second divider, the second hold signal suspending operation of the second divider when asserted;
after asserting the second hold signal, latching a new second divider value into the second divider; and
de-asserting, using the state machine, the second hold signal subsequent to latching the new first divider value into the first divider and latching the new second divider value into the second divider, wherein the first hold signal is de-asserted subsequent to latching the new first divider value into the first divider and latching the new second divider value into the second divider such that the first divider and the second divider are released in tandem.

14. The method of claim 13, further comprising receiving, at a second clock input of the second divider, the frequency signal.

15. The method of claim 14, further comprising:
counting, using a second counter of the second divider, edges of the frequency signal, wherein the second counter counts the second number of clock edges that have transpired from the second phase reference clock edge.

16. The method of claim 13, wherein the second divider is concatenated with the first divider, further comprising receiving, at a second clock input of the second divider, a first clock signal from the first divider.

17. The method of claim 13, further comprising:
updating, at a divider value register, a plurality of divider values to store the new first divider value and the new second divider value when a register update trigger signal is asserted at the divider value register,
loading, using the first divider, the new first divider value in response to the state machine asserting a first load signal of the first divider, and
loading, using the second divider, the new second divider value in response to the state machine asserting a second load signal of the second divider.

18. The method of claim 17, further comprising asserting, using the state machine, the first load signal and the second load signal after:
register update trigger signal has been first asserted at the divider value register; and
the new first divider value and the new second divider value are stored in the divider value register.

19. The method of claim 13, further comprising:
identifying, using a process scheduling and monitoring unit, a change in processor loading conditions of a digital processor system including the first divider and the second divider;
providing, using the process scheduling and monitoring unit, a loading condition signal to the state machine in response to identifying the change in the processor loading conditions; and
receiving, using the state machine, the loading condition signal, wherein the new first divider value is latched into the first divider and the new second divider value is latched into the second divider in response to receiving the loading condition signal.

20. The method of claim 13, further comprising:
providing, using the first divider, a first clock signal to a first peripheral unit of the digital processing system; and
providing, using the second divider, a second clock signal to a second peripheral unit of the digital processing system.

* * * * *